United States Patent
Hamzehdoost

(10) Patent No.: US 6,468,834 B1
(45) Date of Patent: Oct. 22, 2002

(54) METHOD OF FABRICATING A BGA PACKAGE USING PCB AND TAPE IN A DIE-UP CONFIGURATION

(76) Inventor: Ahmad Hamzehdoost, 8326 Blue Quail Ct., Sacramento, CA (US) 95828

(*) Notice: Subject to any disclaimer, the term of this patent is extended or adjusted under 35 U.S.C. 154(b) by 0 days.

(21) Appl. No.: 09/452,851

(22) Filed: Dec. 2, 1999

Related U.S. Application Data

(62) Division of application No. 09/195,349, filed on Nov. 18, 1998, now Pat. No. 6,069,407.

(51) Int. Cl.⁷ .............................................. H01L 21/48
(52) U.S. Cl. ...................... 438/119; 438/109; 438/126; 438/127
(58) Field of Search .................. 438/106, 108, 438/109, 110, 118, 119, 124, 126, 127; 257/686, 700, 737, 738, 774, 783; 361/718, 720, 764, 767, 803

(56) References Cited

U.S. PATENT DOCUMENTS

| | | | |
|---|---|---|---|
| 5,404,044 A | 4/1995 | Booth et al. | 257/698 |
| 5,477,082 A * | 12/1995 | Buckley, III et al. | 257/679 |
| 5,530,288 A | 6/1996 | Stone | 257/700 |
| 5,640,051 A | 6/1997 | Tomura et al. | 257/778 |
| 5,659,952 A * | 8/1997 | Kovac et al. | 29/840 |
| 5,763,939 A | 6/1998 | Yamashita | 257/668 |
| 5,783,865 A | 7/1998 | Highashiguchi et al. | 257/774 |
| 5,909,058 A | 6/1999 | Yano et al. | 257/712 |
| 5,999,415 A * | 12/1999 | Hamzehdoost | 361/803 |
| 6,069,407 A * | 5/2000 | Hamzehdoost | 257/774 |

FOREIGN PATENT DOCUMENTS

| | | | |
|---|---|---|---|
| JP | 3-71648 | * | 3/1991 |
| JP | 6-291165 | * | 10/1994 |

* cited by examiner

*Primary Examiner*—Olik Chaudhuri
*Assistant Examiner*—Alonzo Chambliss

(57) ABSTRACT

A die-up configuration includes a rigid circuit board with electrically conductive plated-through holes formed therethrough and an integrated-circuit die mounted to the upper surface of which a flexible insulated tape layer is fixed to the upper surface of a rigid circuit board and which has a number of wire-bonding sites. Conductive vias or plated-through holes are provided for connecting the wire-bonding sites on the upper surface of the flexible insulated tape layer to the contact areas formed on the lower surface of the flexible insulated tape layer. Conductors are provided for connecting respective contact areas on the lower surface of the flexible insulated tape layer to solder balls on the bottom of the rigid circuit board.

13 Claims, 1 Drawing Sheet

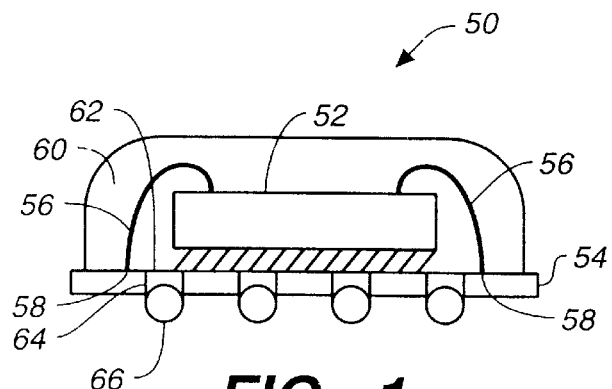
FIG._1
*(PRIOR ART)*
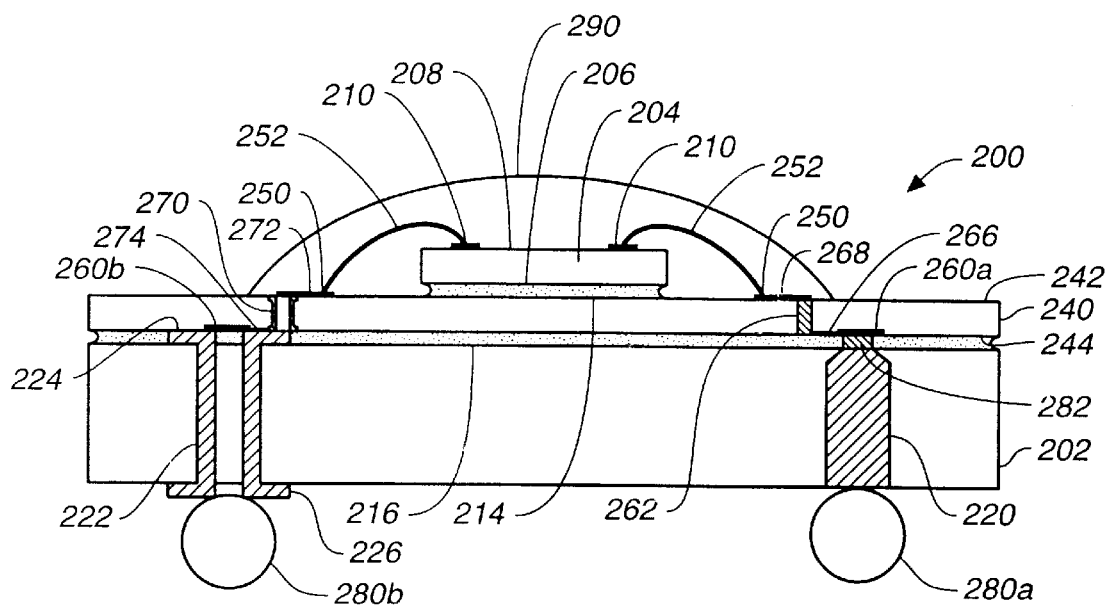
FIG._2

METHOD OF FABRICATING A BGA PACKAGE USING PCB AND TAPE IN A DIE-UP CONFIGURATION

This application is a Divisional Patent Application of U.S. patent application Ser. No. 09/195,349, Filed Nov. 18, 1998, now U.S. Pat. No. 6,069,407.

BACKGROUND OF THE INVENTION

1. Field of the Invention

This invention relates to improvements in die-up ball grid array BGA packages for integrated circuits.

2. Prior Art

FIG. 1 illustrates a conventional die-up fine pitch ball grid array FPBGA package 50 in which an integrated-circuit die 52 is adhesively mounted to a top surface of a flexible, insulated polyimide tape 54. Bonding wires 56 are connected between wire-bonding pads on a top surface of the integrated-circuit die 52 and wire-bonding sites 58 on the top surface of the insulated polyimide tape layer 54. The integrated-circuit die, the bonding wires, and the conductive bonding sites on the top side of the insulated tape layer are all encapsulated in an encapsulation cap 60.

Conductive tras are formed on the top surface of the insulated polyimide tape. The conductive traces provide connections between the wire-bonding sites 58 and a number of solder-ball mounting areas, typically shown as 62, which are also formed on the top side of the insulated polyimide tape. A number of holes, typically shown as 64, are formed through the insulated polyimide tape layer to expose the bottom sides of the solder-ball mounting areas 62 on the top side of the insulated polyimide tape. The holes allow solder balls, typically shown as 66, to be attached through the holes in the insulated polyimide tape to the solder-ball mounting areas on the top side of the insulated polyimide tape.

The solder-ball mounting areas are arranged in a grid pattern. In order to mount an HBGA package to the surface of a printed-circuit board, the grid pattern of the solder balls is placed over a corresponding grid pattern of solderable areas on the printed-circuit board. The solder balls are then heated to a temperature sufficient to melt the solder balls and to solder the BGA package to the surface of the printed-circuit board.

The insulated polyimide tape layer of a conventional die-up BGA package is good for routing of conductive traces but is limited when solder ball pads are to be attached to the tapes because the conductive traces have to go around the solder ball pads which interfere with routing of the conductive traces on the insulated tape layer. A Problem with a conventional die-up BGA package, which uses an insulated polyimide tape layer, is that, particularly for large body sizes, warpage can occur due to the thinness and softness of the tape.

SUMMARY OF THE INVENTION

The invention provides a solution to the routing problems by combining an insulated tape layer with circuit board technology. This approach keeps costs down and depends only on well-developed via technology for printed circuit boards while leaving the routing of conductive traces to tape technology.

A die-up BGA package for an integrated-circuit die includes a rigid circuit board having a plurality of electrically conductive plated-through holes formed therethrough where each of the plated-through holes has a top surface and a bottom surface. An integrated-circuit die has a bottom die-mounting surface which is mounted to the top surface of the rigid circuit board.

A flexible insulated tape layer has a lower surface fixed to the upper surface of the rigid circuit board. A central opening is formed in the tape layer to accommodate mounting of the integrated-circuit die to the upper surface of the rigid circuit board. The upper surface of the flexible insulated tape layer has a number of wire-bonding sites formed thereupon and the lower surface of the flexible insulated tape layer has a number of contact areas formed thereupon.

Means are provided for electrically connecting the wire-bonding sites on the upper surface of the flexible insulated tape layer to the contact areas formed on the lower surface of the flexible insulated tape layer. Such connection means include vias formed through the flexible insulated layer and filled with conductive material such as solder. Conductive traces are formed on the upper surface of the flexible insulated tape layer for the connecting wire-bonding sites formed on the upper surface to the conductive vias. Such conductive means alternatively includes plated-through holes.

Bonding-wire loops are connected between wire-bonding pads formed on the integrated-circuit die and wire-bonding sites on the upper surface of the flexible insulated tape layer.

Means are provided for connecting the top and bottom surfaces of the rigid circuit board, including vias filled with solder and plated-through holes. The solder balls are connected to the lower surface of the plated-through holes or conductive vias. An encapsulation layer covers the integrated-circuit die and the bonding wires.

For the die-up configuration, the flexible insulated tape is supported by the rigid circuit board and the plated through holes provide connections for the solder balls on the bottom side of the rigid circuit board to the contact areas on the flexible insulated tape which are located adjacent the top side of the rigid circuit board.

Die-up HBGA packages produced according to the present invention have the advantage that no large openings are required through the insulated tape layer to allow solder balls to extend through such openings to contact areas on the top surface of the insulated tape layer. HBGA packages produced according to the present invention have another advantage that routing of conductive traces on the top side of the insulated tape layer is easier because the solder balls contact vias in the insulated tape layer. HBGA packages produced according to the present invention also have the advantage that existing via fabrication techniques can be used to form vias in the insulated tape layer. HBGA packages produced according to the present invention also have the advantage that the circuit boards have only vias and no etched conductors so that they can be produced relatively inexpensively.

BRIEF DESCRIPTION OF THE DRAWINGS

The accompanying drawings, which are incorporated in and form a part of this specification, illustrate embodiments of the invention and, together with the description, serve to explain the principles of the invention:

FIG. 1 is a side sectional view of a conventional die-up fine pitch ball grid array FPBGA package which mounts an integrated-circuit die to a flexible tape.

FIG. 2 is a sectional view of an improved encapsulated cavity-up BGA package which uses a circuit board with plated through holes according to the invention.

DETAILED DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover any alternatives, modifications and equivalents, which may be included within the spirit and scope of the invention as defined by the appended claims.

FIG. 2 illustrates an embodiment of an improved encapsulated die-up BGA package 200 which uses a rigid printed board 202, formed, for example, of epoxy or ceramic. An integrated-circuit die 204 has a die-mounting bottom surface 206 and a top surface 208 which has wire-bonding pads, typically shown as 210, formed thereupon. The die-mounting surface 206 of the integrated-circuit 204 is mounted to the upper surface of a flexible insulated tape layer 240 with a die-attach layer 214.

The rigid circuit board 202 has a plurality of electrical conductors which connect between its top and bottom surfaces. Two types of conductors are illustrated. Vias, typically shown as 220, are holes filled with an electrically conductive material, such as solder. Alternatively, electrically conductive plated-through holes 222 are formed through the circuit board, where each of the plated-through holes 222 has a respective top surface 224 and a respective bottom surface 226.

The flexible insulated tape layer 240 is formed, for example, of a polyimide material, and has an upper surface 242 and a lower surface 244. The lower surface 244 of the flexible insulated tape layer 240 is fixed to the upper surface of the rigid circuit board with a layer of adhesive material 216. The upper surface 242 of the flexible insulated tape layer has a number of wire-bonding sites, typically shown as 250, formed thereupon. A plurality of bonding-wire loops, typically shown as 252, each have one end bonded to one of the wire-bonding pads 210 formed on the integrated-circuit die while the other end is bonded to a respective one of the wire-bonding sites 250 on the upper surface of the flexible insulated tape layer 240.

The lower surface 242 of the flexible insulated tape layer 240 has a number of contact areas, typically shown as 260a, 260b. The wire-bonding sites 250 on the upper surface of the flexible insulated tape layer 240 are electrically connected to the contact areas 260a formed on the lower surface 244 of the flexible insulated tape layer 240 in two ways.

One way that these connections are made is through the insulated tape layer with vias which are holes 262 filled with a conductive material, such as solder. Conductive traces 266 connect the conductive vias to the contact area 260a. Conductive traces 268 connect the wire-bonding site 250 to the via 262.

Another way that these connections are made through the insulated tape layer 240 is with plated-through holes 270, the top surfaces of which contact traces 272 which are connected to the wire-bonding site 250. The lower surfaces of the plated through holes 270 are connected by conductive traces 274 to the contact area 260b.

For connecting through the rigid circuit board, connections between the contact area 260a and the solder ball 280a are made through the solder filled via 220, the top of which contacts a plug of conductive adhesive material 282 which connects to the contact area 260a Alternatively, connection between the contact areas 260b and the solder balls 280b are made with the plated-through holes 222. The solder balls are arranged on the package in the well-known grid pattern for ball grid array packages.

Sealing means, such as an encapsulant cap 290 cover and seal the integrated-circuit die and the bonding wires.

In summary, the flexible insulated tape is supported by the rigid board and the plated-through through holes or vias provide connections for the solder balls on the bottom side of the rigid circuit board to the contact areas on the flexible insulated tape which are located adjacent the top side of the rigid board.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed:

1. A method of packaging an integrated circuit die in a die-up BGA package, comprising the steps of:

forming a plurality of electrical conductors through a rigid circuit board between the top surface and the bottom surface of the rigid circuit board, where each of the electrical conductors have a contact area at the top surface of the rigid circuit board;

fixing a lower surface of a flexible insulated tape layer to the top surface of the circuit board, wherein the upper surface of the flexible insulated tape layer has a number of wire-bonding sites formed thereon, and wherein the lower surface of the flexible insulated tape layer has a number of tape-contact areas formed thereon;

mounting a die-mounting surface of the integrated-circuit die to an upper surface of the flexible insulated tape layer;

electrically connecting the wire-bonding sites on the upper surface of the flexible insulated tape layer to the tape-contact areas formed on the lower surface of the flexible insulated tape layer, using conductive vias, which are formed through the flexible insulated layer, which are filled with conductive material, and which are also connected to conductive traces formed on the upper surface of the flexible insulated tape layer, where the conductive traces provide connections to the wire bonding sites.

bonding each of a plurality of bonding-wire loops between one of the wire-bonding pads formed on the integrated-circuit die and a respective one of the wire-bonding sites on the upper surface of the flexible insulated tape layer;

connecting each of the tape-contact areas on the lower surface of the flexible insulated tape layer to respective contact areas at the top surface of the rigid circuit board;

connecting a plurality of solder balls to the lower surface of rigid circuit board and to the electrical conductors formed through the rigid circuit board; and covering and sealing the integrated-circuit die and the bonding wires with an encapsulation layer.

2. The method of claim 1 including the step of forming the electrical conductors through the rigid circuit board using plated-through holes with the top surfaces of the plated-through holes forming the contact areas at the top surface of the rigid circuit board.

3. The method of claim 1 including the step of forming the electrical conductors through the rigid circuit board using vias filled with conductive material with the top surfaces of the vias filled with conductive material forming the contact areas at the top surface of the rigid circuit board.

4. The method of claim 1 including the step of arranging the plurality of solder balls connected to the lower surface of the rigid circuit board in a grid pattern.

5. The method of claim 1 including the step of forming the rigid circuit board as an epoxy printed-circuit board.

6. The method of claim 1 including the step of forming the rigid circuit board as a ceramic circuit board.

7. A method of packaging an integrated circuit die in a die-up BGA package, comprising the steps of:

forming a plurality of electrical conductors through a rigid circuit board between the top surface and the bottom surface of the rigid circuit board, where each of the electrical conductors have a contact area at the top surface of the rigid circuit board;

fixing a lower surface of a flexible insulated tape layer to the top surface of the circuit board, wherein the upper surface of the flexible insulated tape layer has a number of wire-bonding sites formed thereon, and wherein the lower surface of the flexible insulated tape layer has a number of tape-contact areas formed thereon;

mounting a die-mounting surface of the integrated-circuit die to an upper surface of the flexible insulated tape layer;

electrically connecting the wire-bonding sites on the upper surface of the flexible insulated tape layer to the tape-contact contact areas formed on the lower surface of the flexible insulated tape layer, using plated through holes, which are formed through the flexible insulated layer and which are connected to conductive traces formed on the upper surface of the flexible insulated tape layer, where the conductive traces provide connections to the wire bonding sites;

bonding each of a plurality of bonding-wire loops between one of the wire-bonding pads formed on the integrated-circuit die and a respective one of the wire-bonding sites on the upper surface of the flexible insulated tape layer;

connecting each directly of the tape-contact areas on the lower surface of the flexible insulated tape layer to respective contact areas at the top surface of the rigid circuit board, wherein no solder connection exist between the tape contact areas and the respective contact areas on the rigid circuit board;

connecting a plurality of solder balls to the lower surface of rigid circuit board and to the electrical conductors formed through the rigid circuit board; and covering and sealing the integrated-circuit die and the bonding wires with an encapsulation layer.

8. The method of claim 7 wherein the step of connecting respective contact areas on the lower surface of the flexible insulated tape layer to the respective contact areas at the top surface of the rigid circuit board includes connecting the contact areas at the top surface of the rigid circuit board to respective contact areas on the lower surface of the flexible insulated tape layer through a layer of conductive adhesive material.

9. The method of claim 7 including the step of forming the electrical conductors through the rigid circuit board using plated-through holes with the top surfaces of the plated-through holes forming the contact areas at the top surface of the rigid circuit board.

10. The method of claim 7 including the step of forming the electrical conductors through the rigid circuit board using vias filled with conductive material with the top surfaces of the vias filled with conductive material forming the contact areas at the top surface of the rigid circuit board.

11. The method of claim 7 including the step of arranging the plurality of solder balls connected to the lower surface of the rigid circuit board in a grid pattern.

12. The method of claim 7 including the step of forming the rigid circuit board as an epoxy printed-circuit board.

13. The method of claim 7 including the step of forming the rigid circuit board as a ceramic circuit board.

* * * * *